(12) United States Patent
Min et al.

(10) Patent No.: US 12,356,703 B2
(45) Date of Patent: Jul. 8, 2025

(54) AIR SPACER FORMATION FOR SEMICONDUCTOR DEVICES

(71) Applicant: Taiwan Semiconductor Manufacturing Co., Ltd., Hsin-Chu (TW)

(72) Inventors: Wei-Lun Min, Hsinchu (TW); Chang-Miao Liu, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 199 days.

(21) Appl. No.: 17/814,282

(22) Filed: Jul. 22, 2022

(65) Prior Publication Data

US 2022/0367281 A1 Nov. 17, 2022

Related U.S. Application Data

(62) Division of application No. 16/899,225, filed on Jun. 11, 2020, now Pat. No. 11,527,444.

(60) Provisional application No. 62/905,899, filed on Sep. 25, 2019.

(51) Int. Cl.
| | |
|---|---|
| H10D 84/03 | (2025.01) |
| H01L 21/768 | (2006.01) |
| H10D 64/01 | (2025.01) |
| H10D 84/01 | (2025.01) |
| H10D 84/83 | (2025.01) |

(52) U.S. Cl.
CPC ....... *H10D 84/038* (2025.01); *H01L 21/7682* (2013.01); *H10D 64/017* (2025.01); *H10D 84/0147* (2025.01); *H10D 84/834* (2025.01)

(58) Field of Classification Search
CPC ......... H01L 21/7682; H01L 21/823468; H01L 27/0886; H10D 64/015; H10D 64/679; H10D 30/024; H10D 84/0158; H10D 84/834

See application file for complete search history.

(56) References Cited

U.S. PATENT DOCUMENTS

| | | | |
|---|---|---|---|
| 7,709,903 B2 * | 5/2010 | Wang | H10D 30/797 257/412 |
| 8,039,179 B2 | 10/2011 | Shieh et al. | |
| 8,202,681 B2 | 6/2012 | Lin et al. | |
| 8,728,332 B2 | 5/2014 | Lin et al. | |
| 8,822,243 B2 | 9/2014 | Yan et al. | |
| 9,666,533 B1 | 5/2017 | Basker et al. | |
| 2006/0091468 A1 | 5/2006 | Liaw | |
| 2008/0040697 A1 | 2/2008 | Chidambarrao et al. | |
| 2008/0283937 A1 | 11/2008 | Shin | |
| 2011/0281208 A1 | 11/2011 | Lin et al. | |
| 2012/0278776 A1 | 11/2012 | Lei et al. | |
| 2013/0095629 A1 * | 4/2013 | Ando | H01L 29/785 257/E21.409 |
| 2013/0248950 A1 | 9/2013 | Kang et al. | |

(Continued)

*Primary Examiner* — Tuan A Hoang
(74) *Attorney, Agent, or Firm* — HAYNES AND BOONE, LLP

(57) ABSTRACT

A dummy gate is formed over a substrate. A sacrificial layer is formed over the dummy gate. An interlayer dielectric (ILD) is formed over the dummy gate and over the sacrificial layer. The dummy gate is replaced with a metal-containing gate. The sacrificial layer is removed. A removal of the sacrificial layer leaves air gaps around the metal-containing gate. The air gaps are then sealed.

20 Claims, 14 Drawing Sheets

(56) References Cited

U.S. PATENT DOCUMENTS

| | | |
|---|---|---|
| 2013/0295769 A1 | 11/2013 | Lin et al. |
| 2013/0320451 A1 | 12/2013 | Liu et al. |
| 2014/0193974 A1 | 7/2014 | Lee et al. |
| 2014/0215421 A1 | 7/2014 | Chen et al. |
| 2014/0242794 A1 | 8/2014 | Lin et al. |
| 2014/0264760 A1 | 9/2014 | Chang et al. |
| 2014/0264899 A1 | 9/2014 | Chang et al. |
| 2014/0273442 A1 | 9/2014 | Liu et al. |
| 2014/0273446 A1 | 9/2014 | Huang et al. |
| 2015/0179503 A1* | 6/2015 | Tsai ................ H01L 21/31155 438/433 |
| 2015/0380305 A1* | 12/2015 | Basker ............. H01L 21/76846 257/77 |
| 2017/0110577 A1 | 4/2017 | Wang et al. |
| 2017/0330790 A1 | 11/2017 | He et al. |
| 2018/0166553 A1* | 6/2018 | Lee ..................... H10D 64/015 |
| 2018/0247865 A1* | 8/2018 | Adusumilli ....... H01L 21/76897 |
| 2019/0043959 A1* | 2/2019 | Lee ................. H01L 23/53209 |
| 2019/0172752 A1* | 6/2019 | Hsu .................. H01L 21/31144 |
| 2019/0181223 A1 | 6/2019 | Tang |
| 2019/0206740 A1 | 7/2019 | Shroff et al. |
| 2020/0091345 A1 | 3/2020 | Chiu et al. |

* cited by examiner

AIR SPACER FORMATION FOR SEMICONDUCTOR DEVICES

PRIORITY DATA

The present application is a divisional application of U.S. patent application Ser. No. 16/899,225, filed on Jun. 11, 2020, entitled "Air pacer Formation for Semiconductor Devices", which is a utility application of provisional U.S. patent application 62/905,899, filed on Sep. 25, 2019, entitled "Air Spacer Formation", the disclosures of each which are hereby incorporated by reference in their respective entireties.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as the device sizes continue to get scaled down, parasitic capacitance may increase, which is undesirable since parasitic capacitance may adversely affect device performance such as speed. In order to reduce parasitic capacitance, it may be desirable to form gate spacers that have low dielectric constants, such as air spacers. However, conventional methods of fabrication have not been able to form air spacers reliably. Therefore, although conventional methods of semiconductor fabrication have generally been adequate, they have not been satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figures 1A, 1B:
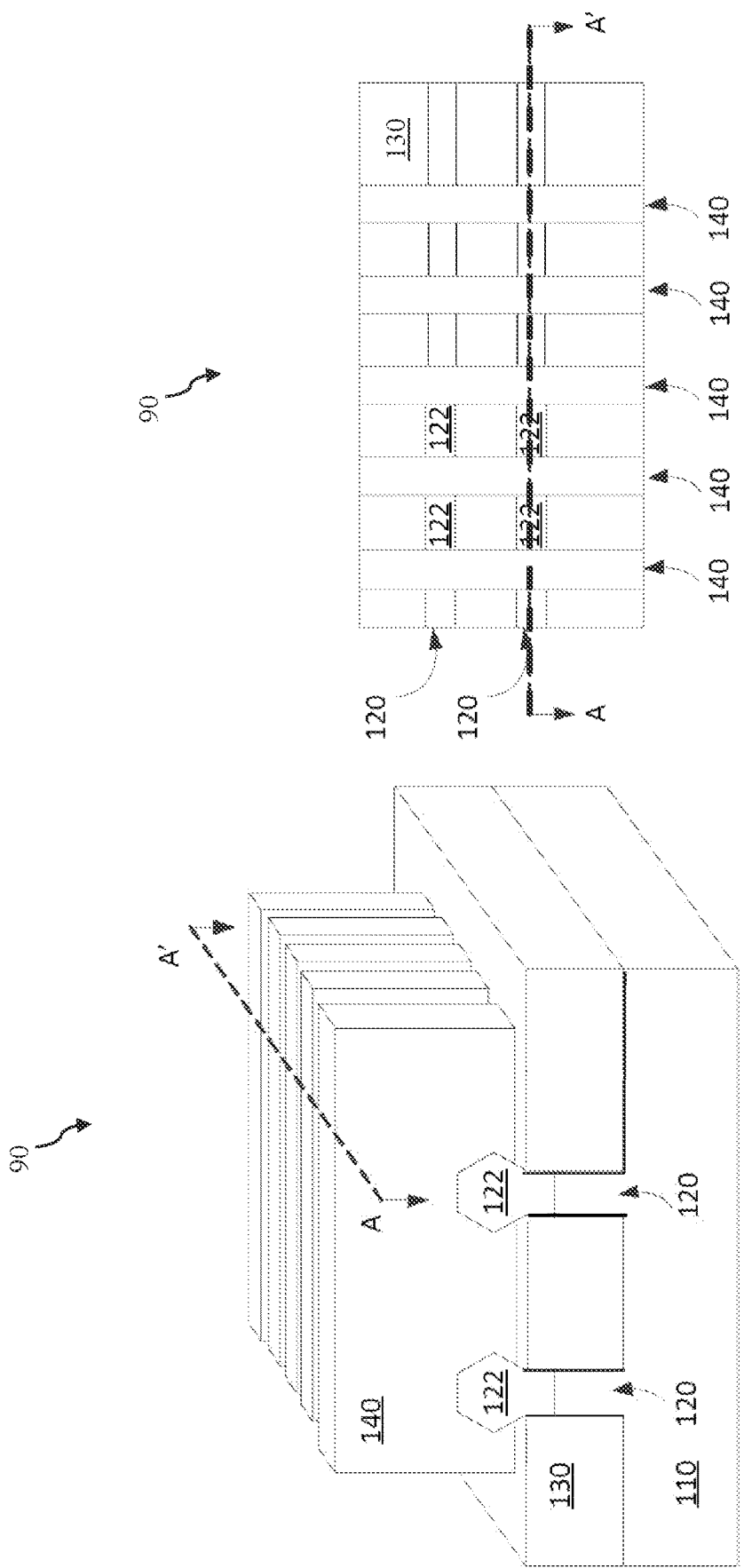
FIG. 1A is a perspective view of an IC device according to various aspects of the present disclosure.
FIG. 1B is a planar top view of an IC device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, and more particularly to field-effect transistors (FETs), such as planar FETs or three-dimensional fin-line FETs (FinFETs). One aspect of the present disclosure involves forming air spacers. In that regard, as semiconductor fabrication progresses to ever smaller technology nodes, the overall contribution made by parasitic capacitance may begin to seriously degrade device performance, such as device speed. Since capacitance is a function of dielectric constant, using low dielectric constant materials may help to reduce parasitic capacitance. For example, it may be desirable to use a low dielectric constant material to form a gate spacer. In that regard, air has a dielectric constant close to 1, which is lower than most dielectric materials. As such, it may be beneficial to use air to implement gate spacers of a FET. Unfortunately, conventional methods of forming air spacers have not been reliable, and/or the resulting air spacer may not be able to achieve the desired size and/or shape that are suitable for modern FET devices.

To overcome the problems discussed above, the present disclosure uses a sacrificial layer to form air spacers. For example, a silicon-containing layer (e.g., amorphous silicon or silicon germanium) may be formed as a sacrificial layer over a gate and over dielectric gate spacers. The sacrificial layer is later removed to form air gaps in place of the removed sacrificial layer. Due to an etching selectivity between the sacrificial layer and the dielectric gate spacers and the gate structure itself, the removal of the sacrificial layer still leaves the dielectric gate spacers and the gate structure substantially intact. A sealing layer may be formed over the air gaps and over the gate structure, thereby trapping the air gaps underneath. The trapped air gaps may serve as air spacers (having a low dielectric constant) for the transistor. The various aspects of the present disclosure are now discussed in more detail below with reference to FIGS. 1A-1B and 2-14.

FIGS. 1A and 1B illustrate a three-dimensional perspective view and a top view, respectively, of a portion of an Integrated Circuit (IC) device 90. The IC device 90 may be a type of IC device where speed is important, for example, it may be a part of a ring oscillator. As such, it is beneficial for the IC device 90 to be implemented with spacers that have a low dielectric constant, which helps reduce the overall parasitic capacitance, thereby improving the speed of the IC device 90.

As illustrated in the Figures below, the IC device 90 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations, unless otherwise claimed. For example, though the IC device 90 as illustrated is a three-dimensional FinFET device, the concepts of the present disclosure may also apply to planar FET devices.

Referring to FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 are elongated fin-like structures that protrude upwardly out of the substrate 110. As such, the active regions 120 may be interchangeably referred to as fins 120 or fin structures 120 hereinafter. The fin structures 120 may be fabricated using suitable processes including photolithography and etch processes. The photo-lithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120.

The IC device 90 also includes source/drain features 122 formed over the fins 120. In some embodiments, the source/drain features 122 may include epi-layers that are epitaxially grown on the fin structures 120.

The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fins 120 on three sides in a channel region of each fin 120. The gate structures 140 may be dummy gate structures (e.g., containing an oxide gate dielectric and a polysilicon gate electrode), or they may be HKMG structures that contain a high-k gate dielectric and a metal gate electrode, where the HKMG structures are formed by replacing the dummy gate structures. Though not depicted herein, the gate structure 140 may include additional material layers, such as an interfacial layer over the fins 120, a capping layer, other suitable layers, or combinations thereof.

Referring to FIG. 1B, multiple fins 120 are oriented lengthwise along the X-direction, and multiple gate structure 140 are oriented lengthwise along the Y-direction, i.e., generally perpendicular to the fins 120. In many embodiments, the IC device 90 includes additional features such as gate spacers (including air spacers) disposed along sidewalls of the gate structures 140, hard mask layer(s) disposed over the gate structures 140, and numerous other features. Due to space considerations, FIGS. 1A and 1B do not specifically illustrate the air spacers that are formed besides the gate structures 140. However, the fabrication processing steps performed to form these air spacers are illustrated in FIGS. 2-14 and discussed below in more detail. In that regard, FIGS. 2-13 are cross-sectional views where the cross-section of the IC device 90 is taken along the dashed line AA' as illustrated in FIGS. 1A-1B, and FIG. 14 is a flowchart illustrating a method of forming air spacers.

Figure 2:
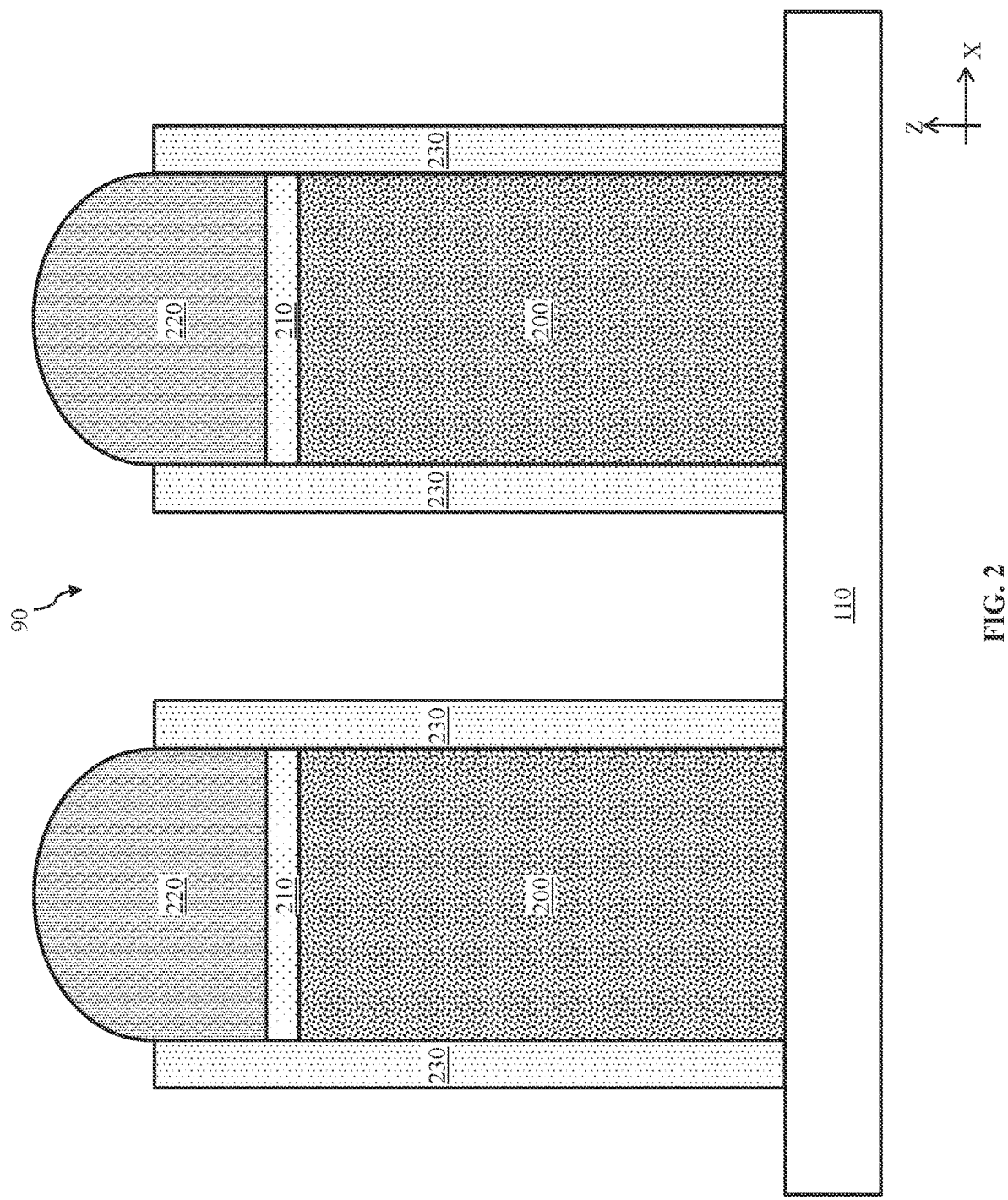
FIGS. 2-13 are cross-sectional views of various embodiments of an IC device of at various stages of fabrication according to various aspects of the present disclosure.

Referring now to FIG. 2, the IC device 90 includes the substrate 110 discussed above. Isolation feature(s) (not shown in FIG. 2) may be formed over and/or in substrate 110 to isolate various regions of the IC device 90. For example, isolation features define and electrically isolate active device regions and/or passive device regions from each other. In some implementations, an isolation feature can be configured to isolate transistors corresponding with the gate structures and the source/drain features from other transistors, devices, and/or regions of the IC device 90. Isolation features include an isolation material, such as silicon oxide, silicon nitride, silicon oxynitride, other suitable isolation material (for example, including silicon, oxygen, nitrogen, carbon, and/or other suitable isolation constituent), or combinations thereof. Isolation features can include different structures, such as shallow trench isolation (STI) structures, deep trench isolation (DTI) structures, and/or local oxidation of silicon (LOCOS) structures.

In some implementations, STI features can be formed by etching trenches in substrate 110 (for example, by using a dry etch process and/or wet etch process) and filling the trenches with insulator material (for example, by using a chemical vapor deposition process or a spin-on glass process). A chemical mechanical polishing (CMP) process may be performed to remove excessive insulator material and/or planarize a top surface of the STI features. In some implementations, STI features can be formed by depositing an insulator material over substrate 110 after forming fins, such that the insulator material layer fills gaps (trenches) between fin structures, and then etching back the insulator material layer. In some implementations, isolation features include multilayer structures that fill trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, isolation features include a dielectric layer disposed over a doped liner layer (including, for example, boron silicate glass or phosphosilicate glass).

At the stage of fabrication shown in FIG. 2, the gate structures 140 (e.g., the high-k metal gates) have not been formed yet. Instead, dummy gate structures 200 are formed over the substrate 110 at this stage of fabrication. In some embodiments, the dummy gate structures may include a high-k gate dielectric (a dielectric material with a dielectric constant greater than a dielectric constant of silicon oxide) and a dummy gate electrode, for example a polysilicon dummy gate electrode. In a gate replacement process performed later, while keeping the high-k gate dielectric intact, the dummy gate electrode may be replaced by a metal-containing gate electrode. In other embodiments, the dummy gate structures may include a dummy gate dielectric and the dummy gate electrode. The dummy gate dielectric may include silicon oxide, for example. In these embodiments, both the dummy gate dielectric and the dummy gate electrode may be replaced. The dummy gate dielectric may be replaced by the high-k gate dielectric, and the dummy gate electrode may be replaced by the metal-containing gate electrode. This variation of the gate replacement process may be referred to as a high-k last process.

Still referring to FIG. 2, patterned hard mask layers 210 and 220 are disposed over the dummy gate structures 200. The patterned hard mask layers 210 and 220 may be formed using one or more deposition processes and patterned using one or more lithography processes. The patterned hard mask layers 210 and 220 may then be used as masks to define (e.g., pattern) the dummy gate structures 200. In some embodiments, the hard mask layers 210 and 220 may contain different types of dielectric materials. For example, the hard mask layer 210 may contain silicon oxide, while the hard mask layer 220 contains silicon nitride, or vice versa.

Dielectric gate spacers 230 may also be formed adjacent to the dummy gate structures 200, for example on the sidewalls of the dummy gate structures 200 in the X-direction. The dielectric gate spacers 230 may be formed by depositing a dielectric material and patterning the dielectric material. The deposited dielectric material may include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 110 and subsequently anisotropically etched to form the dielectric gate spacers 230. In some implementations, the dielectric gate spacers 230 may include a multi-layer structure, such as a first dielectric layer that includes silicon nitride and a second dielectric layer that includes silicon oxide. In some implementations, the dielectric gate spacers 230 may include more than one set of spacers, such as seal spacers, offset spacers, sacrificial spacers, dummy spacers, and/or main spacers, formed adjacent to the gate structures 140. In such implementations, the various sets of spacers can include materials having different etch rates. For example, a first dielectric layer including silicon and oxygen can be deposited over substrate 110 and subsequently anisotropically etched to form a first spacer set adjacent to gate stacks, and a second dielectric layer including silicon and nitrogen can be deposited over substrate 110 and subsequently anisotropically etched to form a second spacer set adjacent to the first spacer set.

Implantation, diffusion, and/or annealing processes may be performed to form lightly doped source and drain (LDD) features and/or heavily doped source and drain (HDD) features (neither of which are shown in FIG. 2) in source/drain (S/D) regions before and/or after the formation of the dielectric gate spacers 230. One or more annealing processes may also be performed to anneal the LDD and HDD features.

Figure 3:
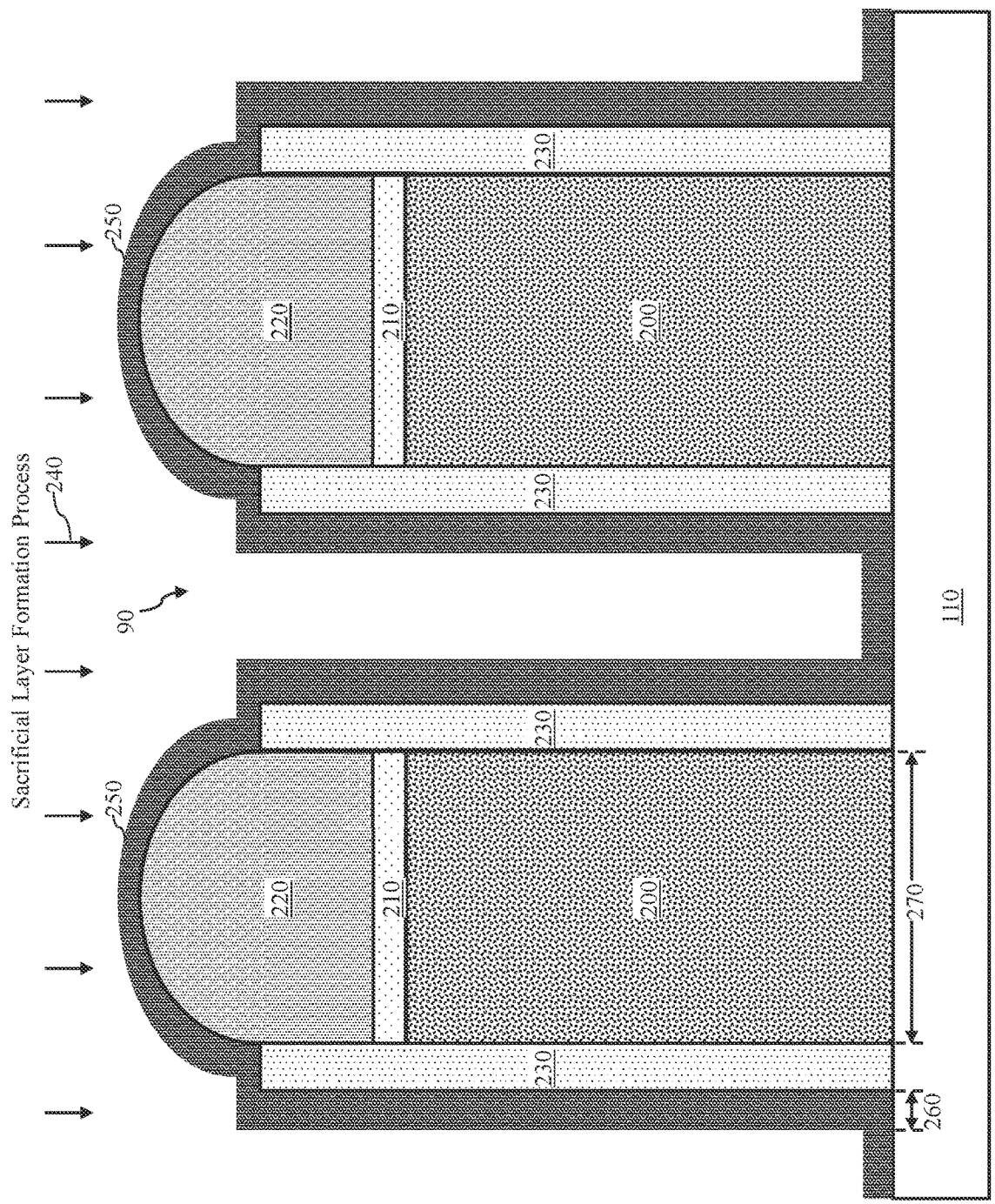

Referring now to FIG. 3, a sacrificial layer formation process 240 is performed to the IC device 90 to form a sacrificial layer 250 over the dummy gate structures 200. For example, the sacrificial layer 250 may be formed on the hard mask layer 220 and on the dielectric gate spacers 230. Portions of the sacrificial layer 250 are disposed on the side surfaces of the dielectric gate spacers 230. As will be discussed in more detail below, the sacrificial layer 250 will be removed, and air spacers will be formed in place of the removed sacrificial layer 250.

The sacrificial layer 250 has a material composition that is different from the dielectric gate spacers 230, such that an etching selectivity may be configured to exist between them. For example, the sacrificial layer 250 may be a silicon-containing layer. In some embodiments, the sacrificial layer 250 includes an amorphous silicon material. In other embodiments, the sacrificial layer 250 includes a silicon germanium (SiGe) material. In some embodiments, the sacrificial layer formation process 240 may include a CVD furnace to grow the amorphous silicon or silicon germanium.

The sacrificial layer 250 may be formed to have a thickness or width 260, which is measured in the X-direction as shown in FIG. 2. The value of the thickness or width 260 may be adjusted by configuring the process parameters of the sacrificial layer formation process 240, for example by configuring the length of the process duration. Since air spacers will be formed by the removal of the sacrificial layer 250, the thickness or width 260 may correspond to the width of the air spacers. In some embodiments, the thickness or width 260 is in a range between about 1 nanometers (nm) and about 5 nm. Such a numerical range for the thickness or width 260 is not randomly chosen but specifically configured to ensure that the air spacers to be formed later has a desired thickness or width. For example, the thickness or width 260 is great enough to reduce the overall dielectric constant of the gate spacers (and thereby lowering the parasitic capacitance), but not too thick to consume chip real estate unnecessarily.

Also note that the thickness or width 260 is substantially smaller than a width 270 of the dummy gate structure 200 in the X-direction. In some embodiments, the thickness or width 260 is at least five times smaller than the width 270. Correspondingly, the sacrificial layer 250 may have a much greater aspect ratio (height versus width) than the dummy gate structures 200, since their heights are roughly equal to another. Such a disparity between the widths 260 and 270 (or the corresponding aspect ratios) may lead to different removal rates between the sacrificial layer 250 and the dummy gate structures 200 during the removal of the dummy gate structures, as discussed below in more detail.

Figure 4:
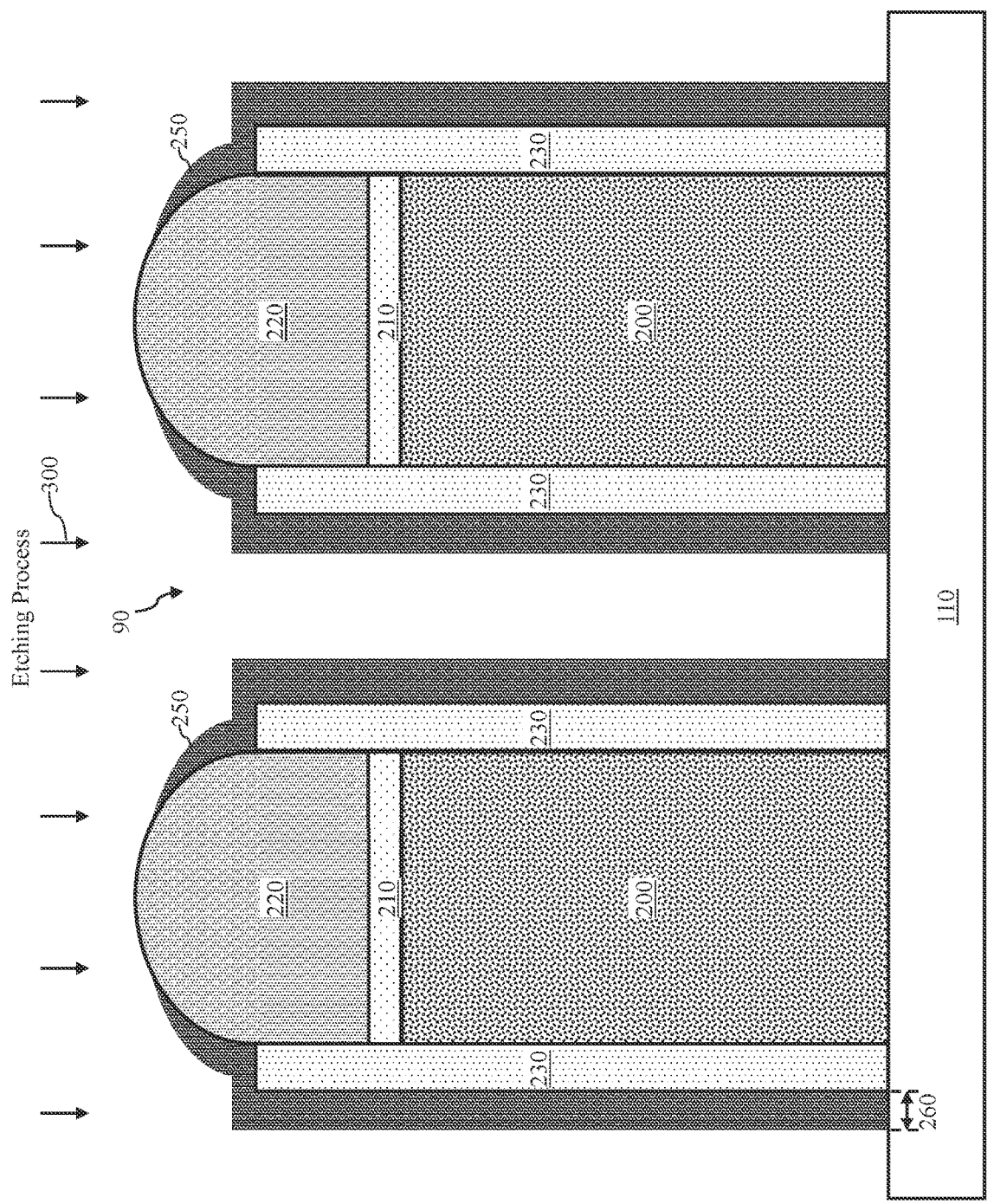

Referring now to FIG. 4, an etching process 300 is performed to the IC device 90. In some embodiments, the etching process 300 includes a wet etching process. The etching process 300 partially etches away the sacrificial layer 250. For example, the portions of the sacrificial layer 250 disposed directly over the hard mask layer 220 are etched away until the upper surface of the hard mask layer 220 is exposed. The etching process 300 also etches away the portions of the sacrificial layer 250 that are disposed directly on the substrate 110. Portions of the sacrificial layer 250 still remain on the side surfaces of the dielectric gate spacers 230 after the performance of the etching process 300.

One reason for performing the etching process 300 is to prevent inadvertent bridging (e.g., electrical shorting). As discussed above, the sacrificial layer 250 includes amorphous silicon or silicon germanium, which are materials that are at least semiconductive. If the sacrificial layer 250 is not removed from these horizontal surfaces (e.g., above the hard mask layer 220 and the substrate 110), its presence may lead to unintentional electrical connectivity between microelectronic components that should be electrically insulated from one another. In other words, without the etching process 300, the semiconductive properties of the sacrificial layer 250 may cause it to inadvertently short out certain microelectronic components. Here, the performance of the etching process 300 ensures that no such electrical shorting will occur, and that the remaining portions of the sacrificial layer 250 are mostly vertically oriented structures, which will facilitate the formation of air spacers, as discussed below in more detail.

Figure 5:
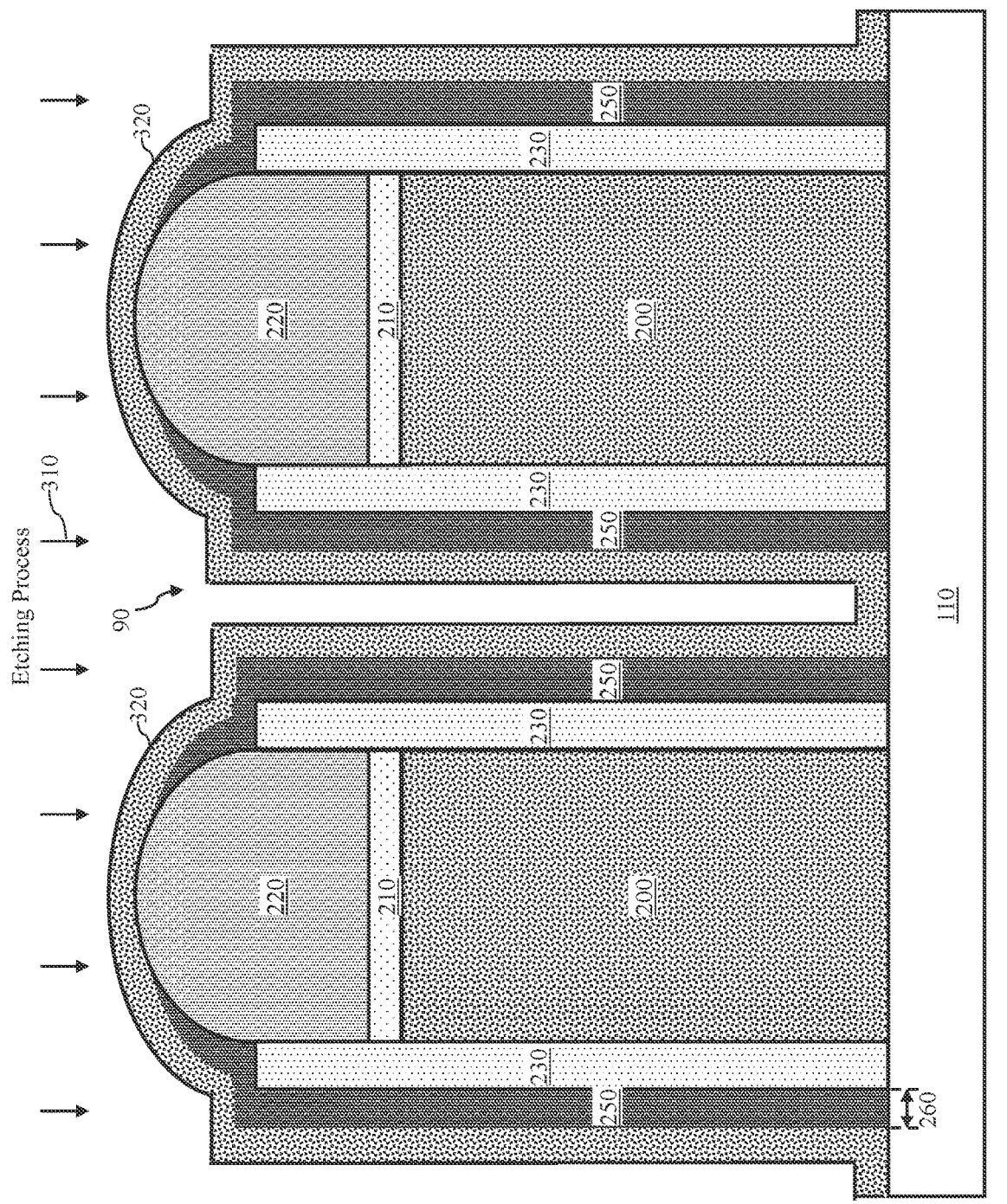

Referring now to FIG. 5, a deposition process 310 is performed to the IC device 90 to form an etching-stop layer 320 over the IC device 90. The deposition process 310 may include CVD, PVD, ALD, HDPCVD, MOCVD, RPCVD, PECVD, LPCVD, ALCVD, APCVD, or combinations thereof. The etching-stop layer 320 has a material composition that is different from the sacrificial layer 250, such that an etching selectivity may exist between them in one or more etching processes performed later. In various embodiments, the etching-stop layer 320 may include a dielectric material such as silicon oxide, silicon nitride, silicon oxynitride, silicon carbide, silicon oxycarbonitride, or combinations thereof, so long as its material composition is different from that of the sacrificial layer 250. As shown in FIG. 5, the etching-stop layer 320 is deposited over the hard mask layer 220 and over the sacrificial layer 250. Portions of the etching-stop layer 320 are deposited on the side surfaces of the sacrificial layer 250. In other words, the sacrificial layer 250 may be disposed directly between the dielectric gate spacers 230 and the etching-stop layer 320.

Figure 6:
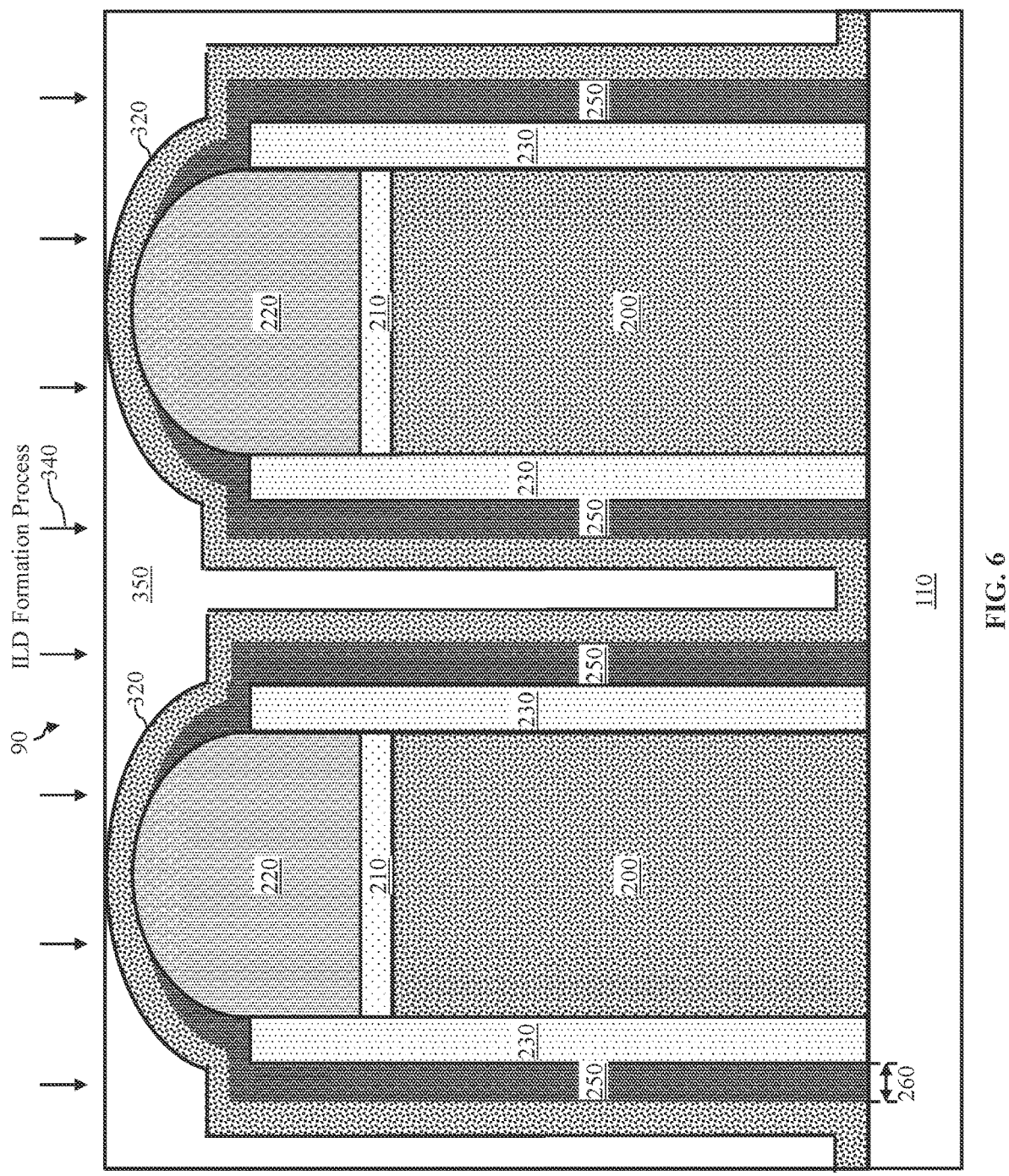

Referring now to FIG. 6, an ILD formation process 340 is performed to the IC device 90 to form an interlayer dielectric (ILD) 350. In some embodiments, the ILD formation process 340 includes a deposition process (such as CVD, PVD, ALD, HDPCVD, MOCVD, RPCVD, PECVD, LPCVD, ALCVD, APCVD, or combinations thereof). In some implementations, the deposition process may include a flowable CVD (FCVD) process that includes, for example, depositing a flowable material (such as a liquid compound) over the substrate 110 and converting the flowable material to a solid material by a suitable technique, such as thermal annealing and/or ultraviolet radiation treating. The ILD formation process 340 also includes one or more CMP process and/or other planarization process following the deposition process. The CMP process may planarize the upper surfaces of the ILD 350 such that ILD 350 has a substantially planar upper surface.

As a result of the ILD formation process 340, the ILD 350 is formed over the substrate 110 and the etching-stop layer 320 in the Z-direction and surrounds the dummy gate structures 200 laterally, for example in the X-direction. In some embodiments, the ILD 350 may include a dielectric material, for example silicon oxide, silicon nitride, silicon oxynitride, TEOS-formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SiLK (Dow Chemical, Midland, Michigan), polyimide, other low-k dielectric material, or combinations thereof. The ILD 350 may also be referred to as an ILD0 layer.

Figure 7:
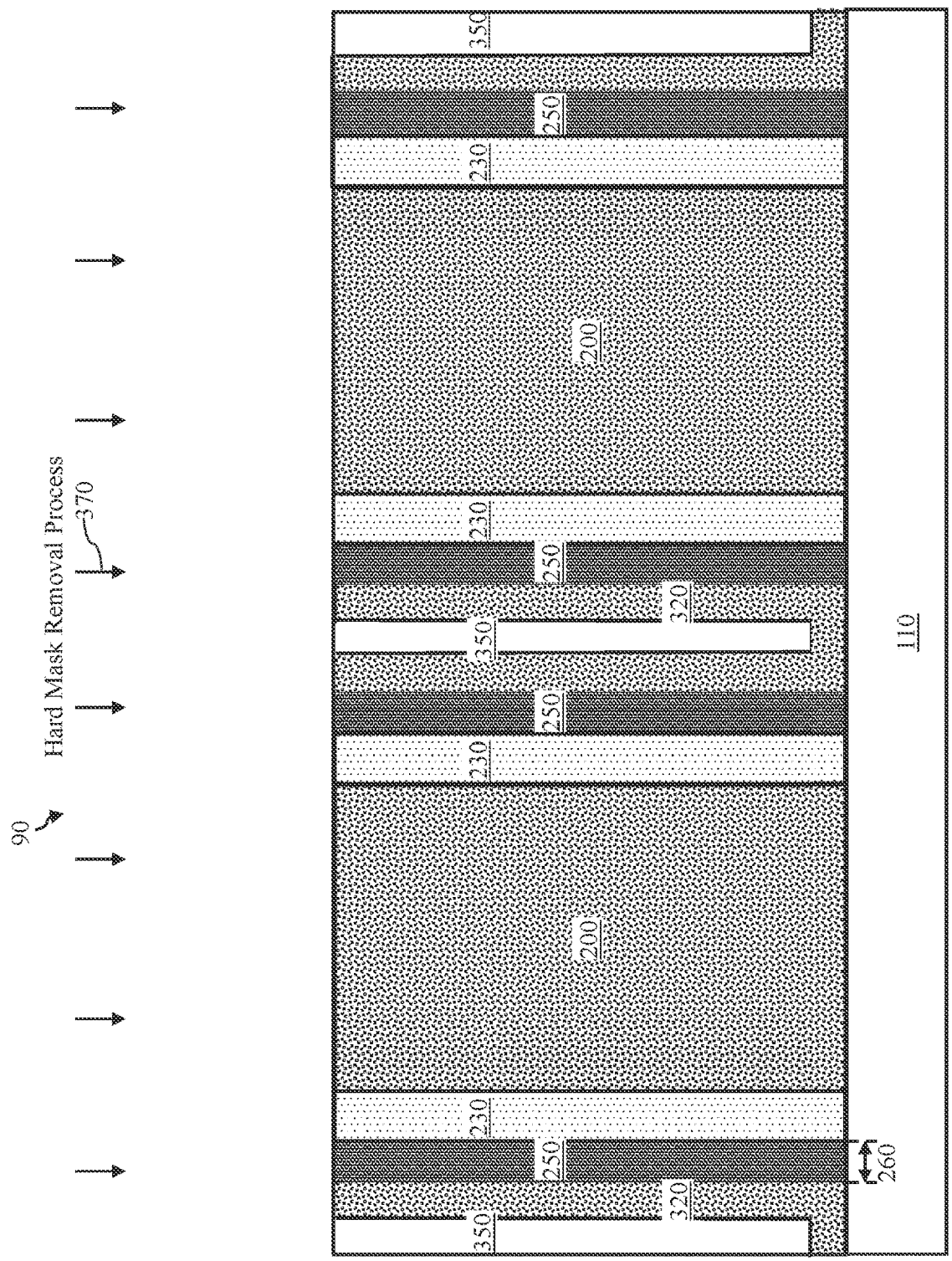

Referring now to FIG. 7, a hard mask removal process 370 is performed to the IC device 90 to remove the hard mask layers 210 and 220. The upper portions of the dielectric gate spacers 230, the sacrificial layer 250, the etching-stop layer 320, and the ILD 350 are also removed by the hard mask removal process 370. In some embodiments, the hard mask removal process 370 includes one or more etching processes and/or polishing processes. After the hard mask removal process 370 has been completed, the upper surfaces of the dummy gate structures 200 are exposed and may be substantially co-planar with the upper surfaces of the remaining portions of the dielectric gate spacers 230, the sacrificial layer 250, the etching-stop layer 320, and the ILD 350.

Figure 8:
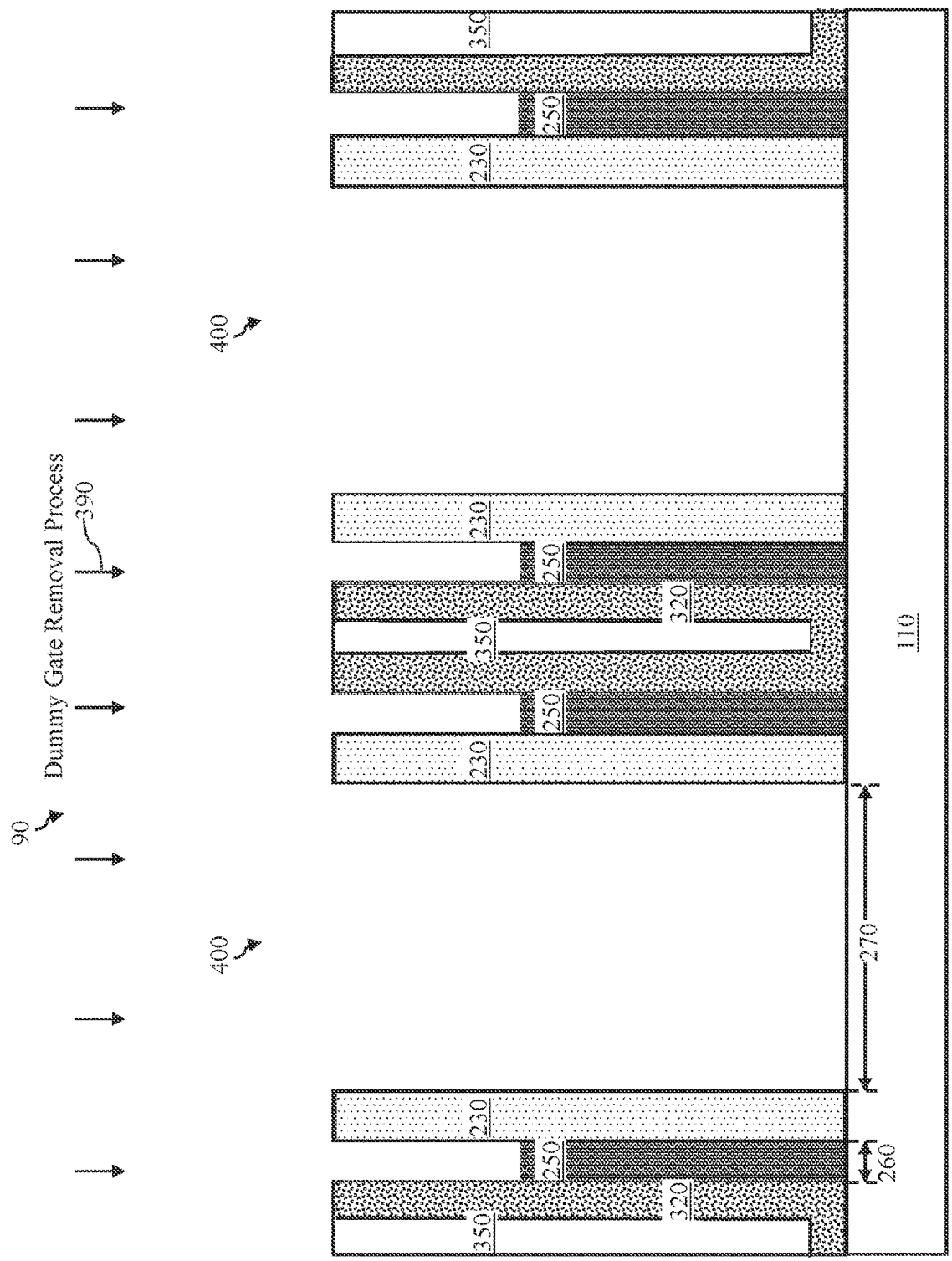

Referring now to FIG. 8, a dummy gate removal process 390 is performed to remove the dummy gate structures 200. The dummy gate removal process 390 may include one or more etching processes to etch away portions of the dummy gate structures 200 without substantially affecting the dielectric gate spacers 230, the sacrificial layer 250, the etching-stop layer 320, and the ILD 350. In embodiments where the dummy gate structures 200 include a dummy polysilicon gate electrode, the dummy polysilicon gate electrode is removed. In embodiments where the dummy gate structures 200 include both a dummy gate dielectric (e.g., silicon oxide gate dielectric) and the dummy polysilicon gate electrode, the dummy gate dielectric and the dummy polysilicon gate electrode are removed by the dummy gate removal process 390. After the performance of the dummy gate removal process 390, openings 400 are formed in place of the removed dummy gate structures 200.

Note that the dummy gate removal process 390 may also partially remove the sacrificial layer 250, as is shown in FIG. 8. In other words, the height of the sacrificial layer 250 may be reduced by the dummy gate removal process 390. This is because the dummy gate structures 200 and the sacrificial layer 250 are both silicon-containing structures. For example, the dummy gate structures 200 may contain polysilicon, and the sacrificial layer 250 may contain amorphous silicon or silicon germanium. Due to their similarity in material composition, it may be difficult to configure a high etching selectivity between the dummy gate structures 200 and the sacrificial layer 250. However, the sacrificial layer 250 has a much smaller lateral dimension (e.g., the width 260 is at least five times smaller than the width 270) and a greater aspect ratio (e.g., height versus width) than the dummy gate structures, which slows down the removal rate of the sacrificial layer 250 compared to the dummy gate structures 200. Accordingly, the dummy gate removal process 390 does not completely remove the sacrificial layer 250, which would have been undesirable since the resulting air gaps (formed by the complete removal of the sacrificial layer 250, if it were to happen) would have been filled by metal materials deposited in a metal gate formation process performed subsequently. In any case, as shown in FIG. 8, although the dummy gate removal process 390 herein may partially remove the sacrificial layer 250, substantial portions of the sacrificial layer 250 still remain after the dummy gate removal process 390 has been performed. These portions of the sacrificial layer 250 will be removed in a later process to form air gaps.

Figure 9:
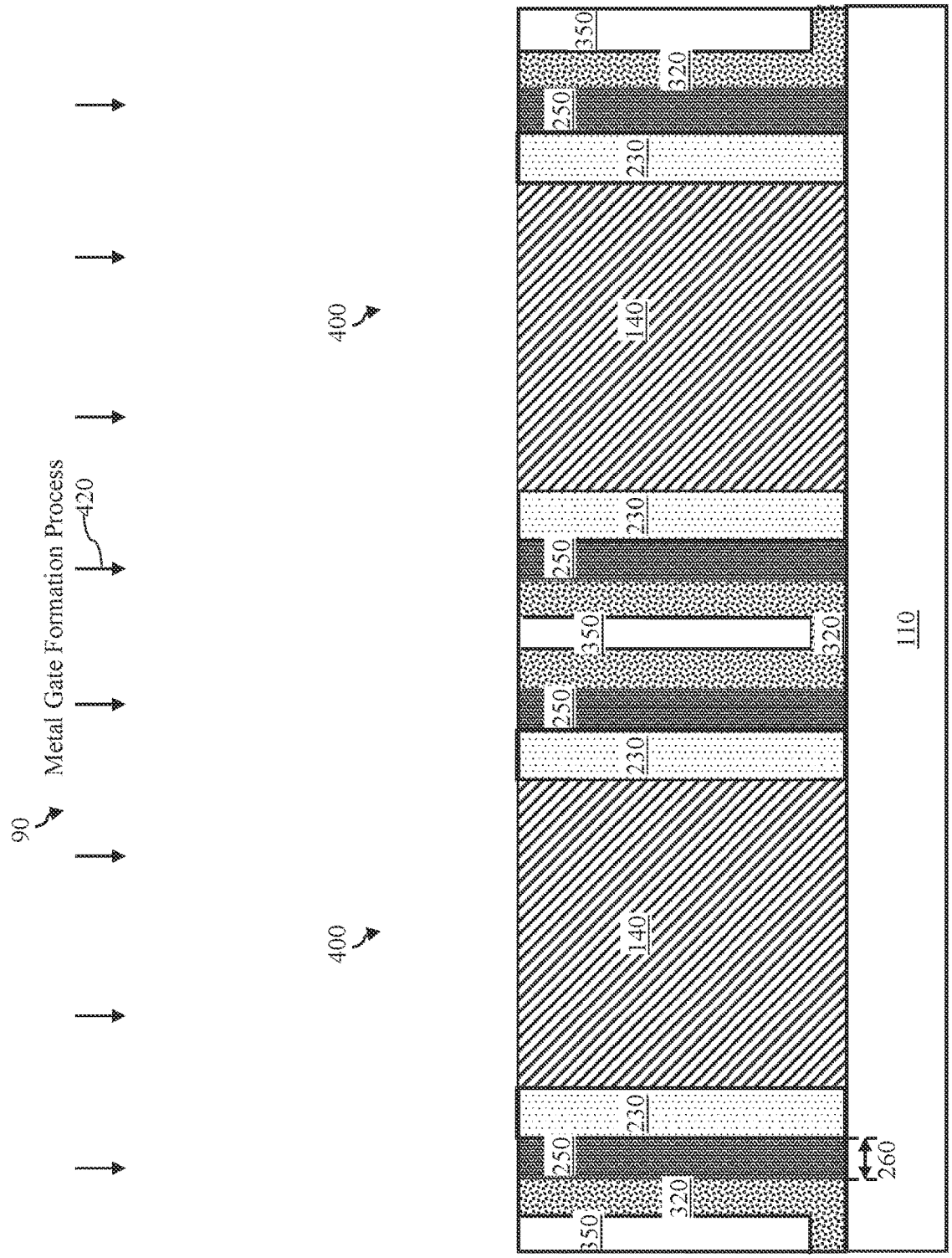

Referring now to FIG. 9, a metal gate formation process 420 is performed to form the gate structures 140 in the openings 400. In some embodiments, the metal gate formation process 420 includes one or more deposition processes to deposit a metal-containing gate electrode to fill the openings 400. In some embodiments, the metal gate formation process 420 includes one or more deposition processes to deposit a high-k gate dielectric layer in the openings 400, and then depositing the metal-containing gate electrode over the high-k gate dielectric layer. The gate structures 140 each interpose a source region and a drain region, where a channel region is defined in substrate 110 between the source region and the drain region. Gate structures 140 engage the channel regions, such that current can flow between the source/drain regions during operation. In some implementations, gate structures 140 are formed over fin structures (e.g., the fin structures 120 of FIGS. 1A-1B), such that the gate structures 140 each wrap a portion of the fin structures. For example, the gate structures 140 wrap channel regions of the fin structures, thereby interposing source regions and drain regions of the fin structure.

In some implementations, the gate dielectric layer is conformally disposed on sidewall surfaces and bottom surfaces of the opening 400, such that the gate dielectric layer is generally U-shaped and has a substantially uniform thickness. In embodiments where the gate dielectric layer includes a high-k dielectric material, such a high-k dielectric material may refer to dielectric materials having dielectric constant greater than a dielectric constant of silicon oxide (k≈3.9). Exemplary high-k dielectric materials may include hafnium, aluminum, zirconium, lanthanum, tantalum, titanium, yttrium, oxygen, nitrogen, other suitable constituent, or combinations thereof. For example, the high-k dielectric material may include, HfO2, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, or combinations thereof. In some implementations, the gate dielectric layer includes a multilayer structure, such as an interfacial layer including, for example, silicon oxide, and a suitable high-k dielectric material formed on the interfacial layer.

The gate electrode of the gate structures 140 includes an electrically conductive material. In some implementations, the gate electrode includes multiple layers, such as one or more capping layers, work function layers, glue/barrier layers, and/or metal fill (or bulk) layers. A capping layer can include a material that prevents and/or eliminates diffusion and/or reaction of constituents between the gate dielectric and other layers of the gate electrode. In some implementations, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. A work function layer includes a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. The gate structures 140 may also include a glue/barrier layer, which can include a material that promotes adhesion between adjacent layers, such as the work function layer and the metal fill layer, and/or a material that blocks and/or reduces diffusion between gate layers, such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu.

It is also understood that the metal gate formation process 420 may include one or more planarization processes, for example CMP processes. For example, after the gate structures 140 are formed in the openings 400, the CMP processes may planarize the upper surfaces of the gate structures 140 until they are substantially co-planar with the upper surfaces of the dielectric gate spacers 230, the sacrificial layer 250, the etching-stop layer 320, and the ILD 350.

Figure 10:
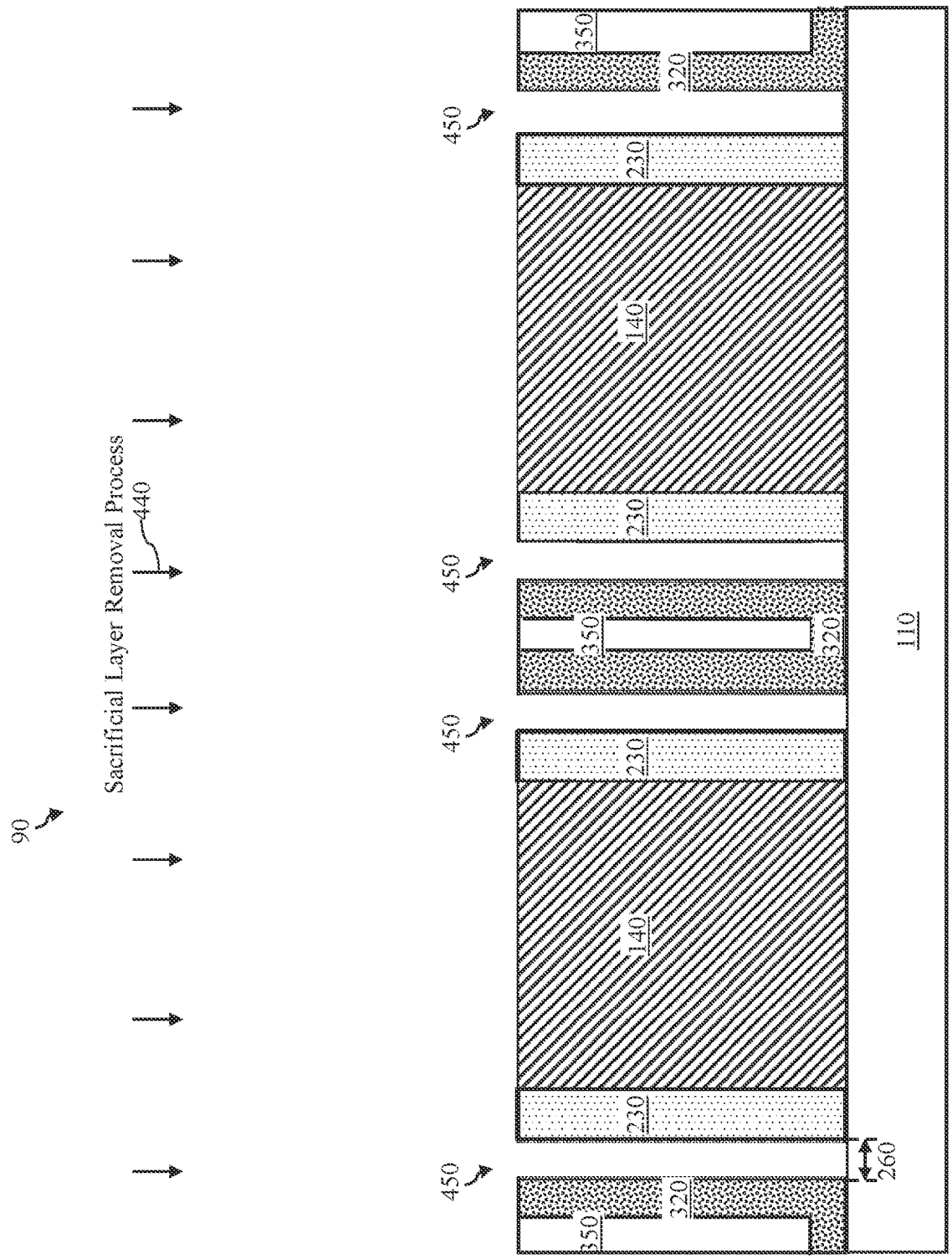

Referring now to FIG. 10, a sacrificial layer removal process 440 is performed to the IC device 90 to remove the sacrificial layer 250. The sacrificial layer removal process 440 may include one or more etching processes. Due to the differences in material composition, an etching selectivity exists between the sacrificial layer 250 and the gate structures 140, between the sacrificial layer 250 and the dielectric gate spacers 230, between the sacrificial layer 250 and the etching-stop layer 320, and between the sacrificial layer 250 and the ILD 350. For example, the one or more etching processes may be configured to etch away the sacrificial layer 250 at a substantially greater rate (e.g., 10 times or more) than the gate structures 140, the dielectric gate spacers 230, the etching-stop layer 320, and the ILD 350. In this manner, the sacrificial layer 250 may be completely etched away while still leaving the gate structures 140, the dielectric gate spacers 230, the etching-stop layer 320, and the ILD 350 substantially intact.

The removal of the sacrificial layer 250 forms air gaps 450 in place of the removed sacrificial layer 250, which may be sealed later to form air spacers for the IC device 90. As shown in FIG. 10, the air gaps 450 are disposed between the dielectric gate spacers 230 and the etching-stop layer 320. The air gaps 450 also each assume a substantially vertically elongated profile or shape in the cross-sectional view of FIG. 10. In other words, the air gaps 450 may resemble vertically standing (e.g., in the Z-direction) columns or strips. Also, the air gaps may have substantially the same width 260 of the sacrificial layer 250, which as discussed above is in a range between about 1-5 nm in some embodiments. Again, this width 260 is adjustable by configuring the process parameters of the sacrificial layer formation process 240 discussed above with reference to FIG. 3.

It is understood that although the air gaps 450 are shown as being formed over the substrate 110, they may be formed over isolation structures such as STI too.

Figure 11:
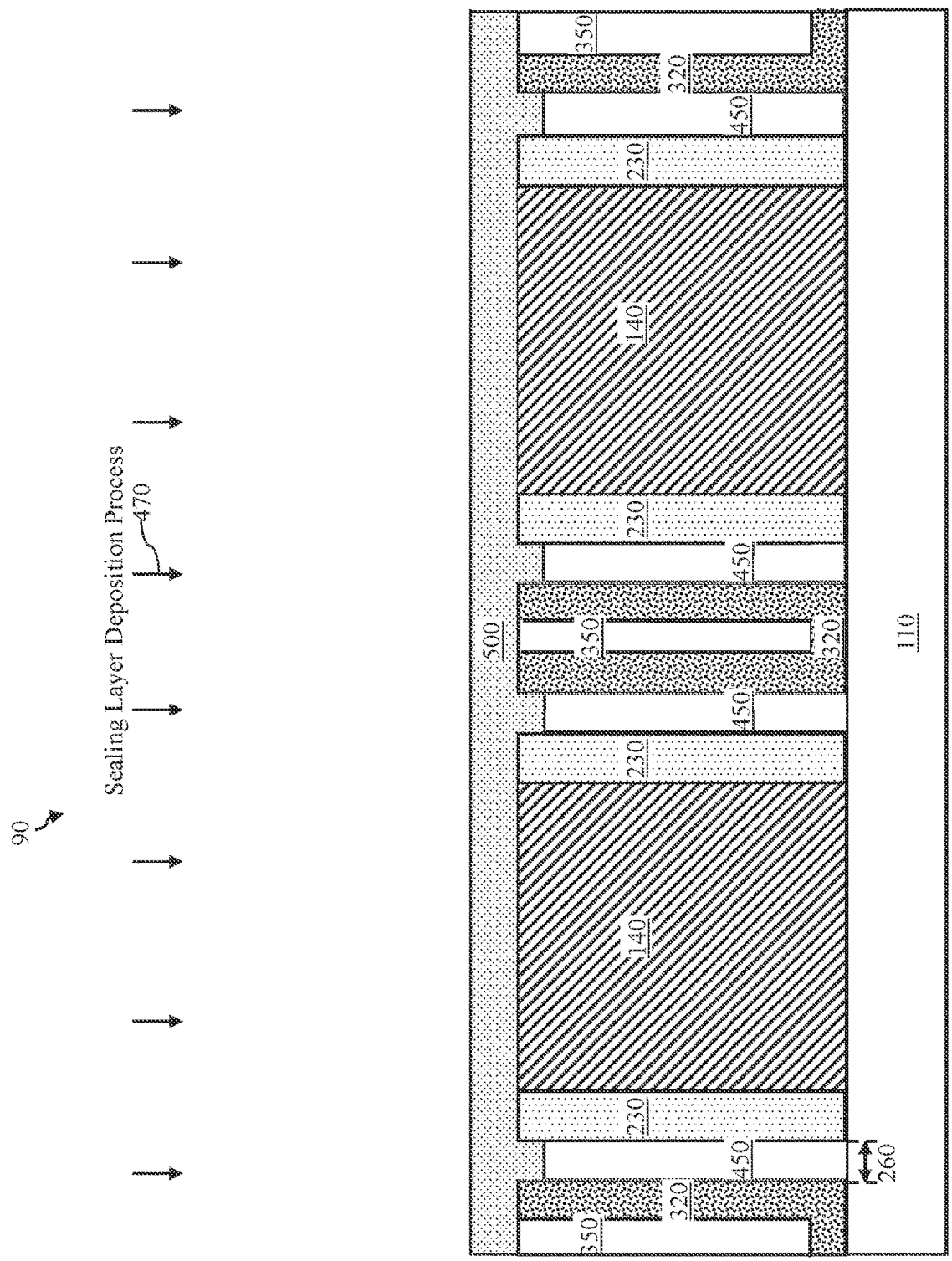

Referring now to FIG. 11, a sealing layer deposition process 470 is performed to the IC device 90 to form a sealing layer 500. The sealing layer 500 is formed over the upper surfaces of the gate structures 140, the dielectric gate spacers 230, the etching-stop layer 320, and the ILD 350. The sealing layer 500 traps the air gaps 450 underneath, where the trapped air gaps 450 serve as air spacers for the IC device 90.

In some embodiments, the sealing layer deposition process 470 includes a deposition process that does not have great gap filling characteristics, for example a CVD process. This is because the deposition process is meant to seal the air gaps 450, rather than filling them completely. Nevertheless, despite the poor gap filling properties, the sealing layer deposition process 470 may still partially fill the air gaps 450. For example, portions of the sealing layer 500 may still extend or protrude downwardly in the Z-direction into the air gaps 450, such that the bottom surfaces of the sealing layer 500 are located at a level that is below (e.g., by 1-2 nanometers) the upper surfaces of the gate structures 140, the dielectric gate spacers 230, the etching-stop layer 320, and the ILD 350. In some embodiments, the sealing layer 500 may be formed to include a dielectric material, such as silicon nitride.

Figure 12:
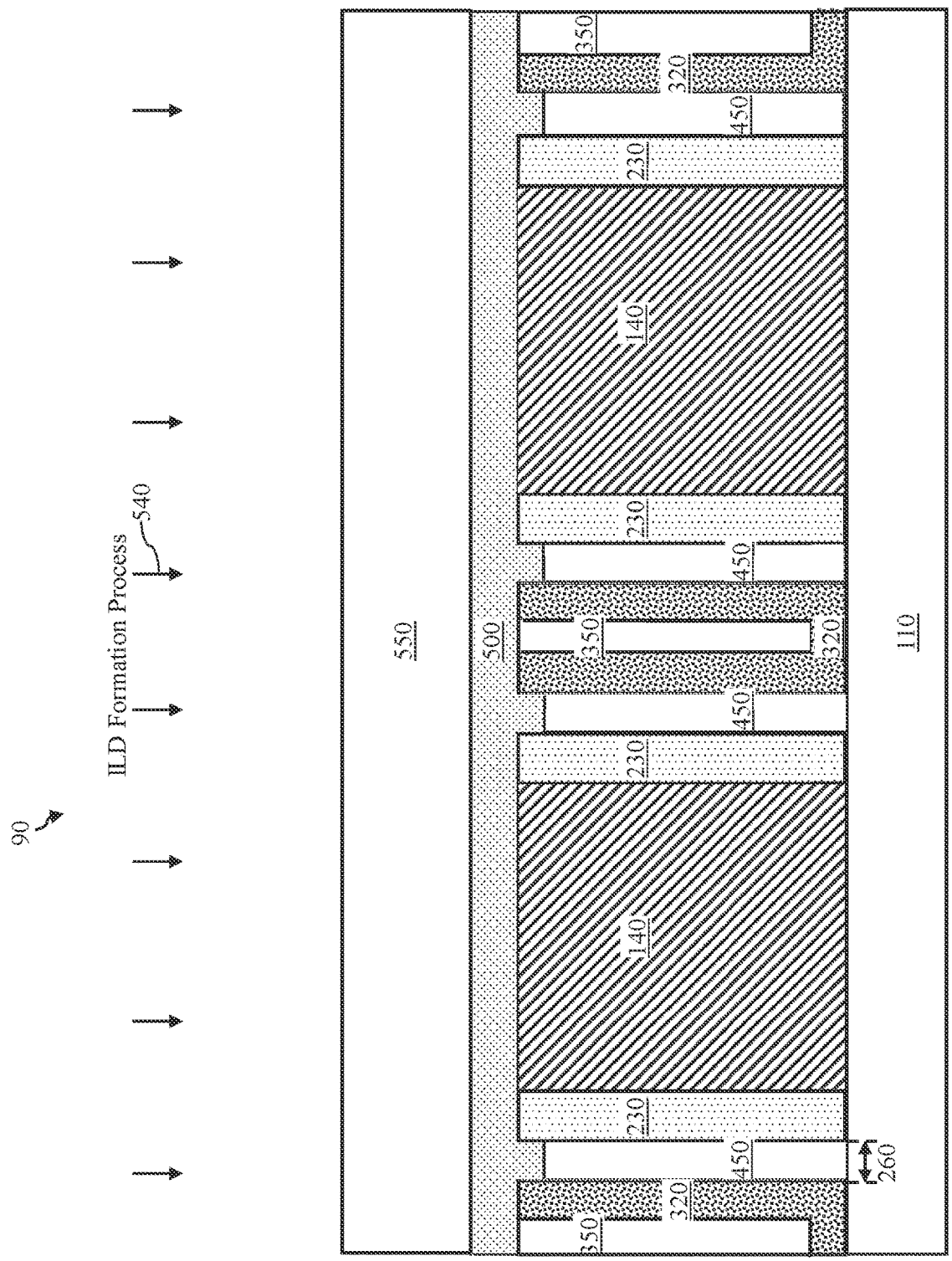

Referring now to FIG. 12, an ILD formation process 540 is performed to the IC device 90 to form another ILD 550. The ILD formation process 520 may include similar steps as the ILD formation process 340 discussed above with reference to FIG. 6, and the resulting ILD 550 is similar in material composition as the ILD 350. For reasons of simplicity, the details of the ILD formation process 540 and the ILD 550 are not repeated herein. The ILD 550 is formed over the sealing layer 500.

Figure 13:
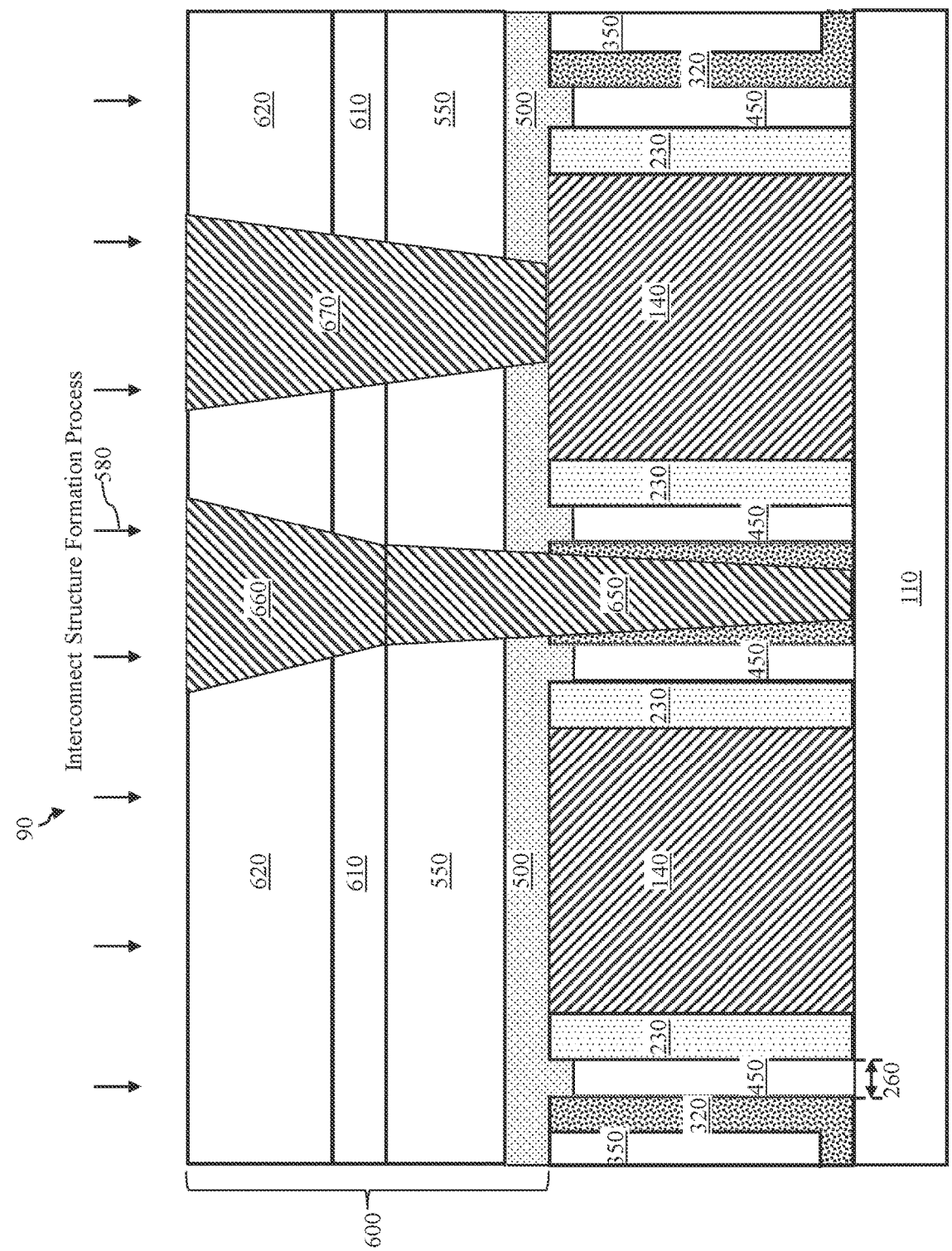
Figure 14:
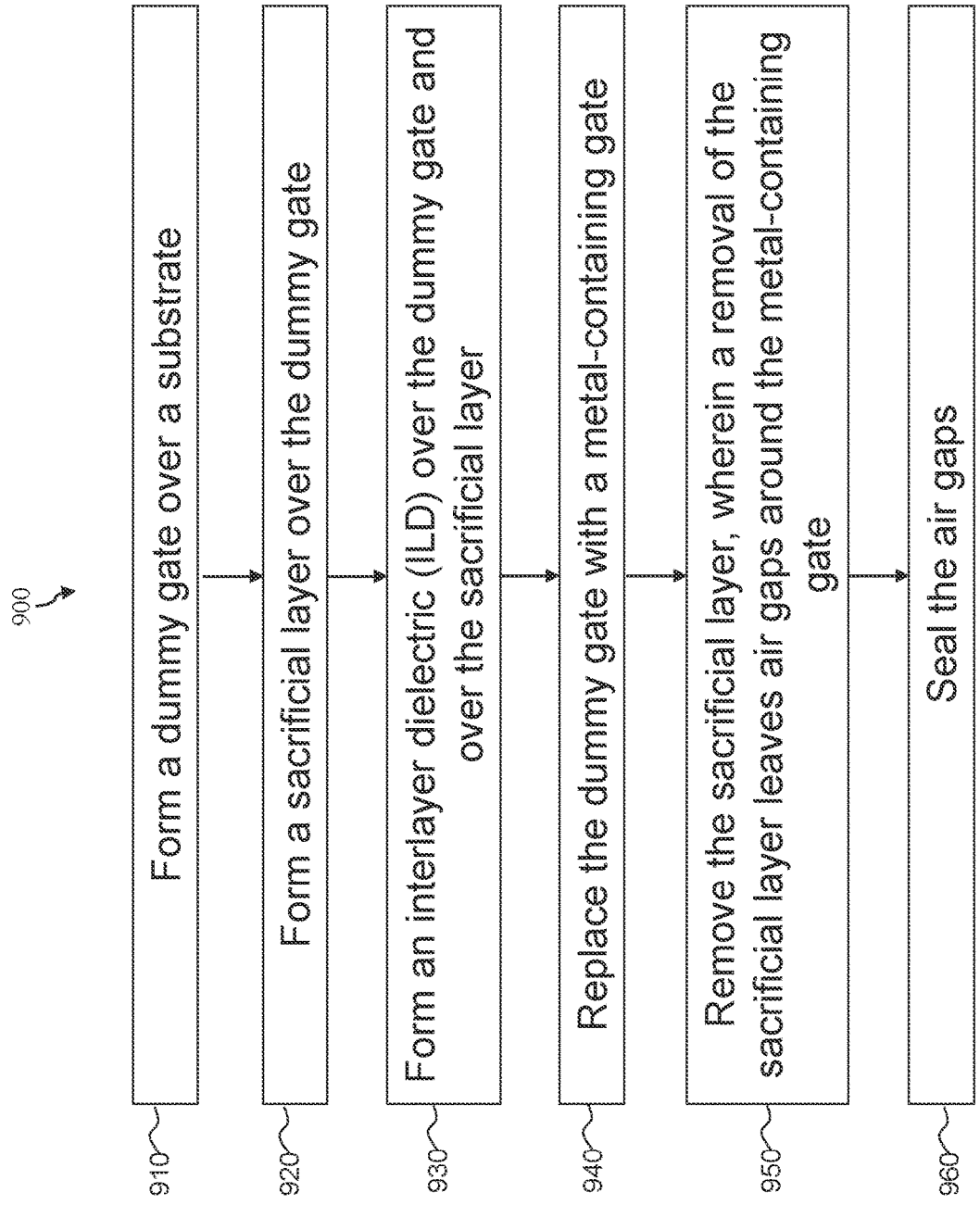
FIG. 14 is a flowchart of a method of fabricating a semiconductor device according to various aspects of the present disclosure.

Referring now to FIG. 13, an interconnect structure formation process 580 is performed to the IC device 90 to form various interconnect components of a multilayer interconnect (MLI) structure 600. The MLI structure 600 electrically couples together various devices (for example, transistors, resistors, capacitors, and/or inductors) and/or components (for example, gate structures and/or source/drain features) of the IC device 90, such that the various devices and/or components operate as specified by design requirements of the IC device 90. The MLI structure 600 includes a combination of dielectric layers and electrically conductive layers (for example, metal layers) configured to form various interconnect structures. The conductive layers are configured to form vertical interconnect features (providing, for example, vertical connection between features and/or vertical electrical routing), such as contacts and/or vias, and/or horizontal interconnect features (providing, for example, horizontal electrical routing), such as conductive lines. Vertical interconnect features typically connect horizontal interconnect features in different layers (or different planes) of the MLI structure 600. During operation, the MLI structure 600 routes signals between the devices and/or the components of the IC device 90 and/or distribute signals (for example, clock signals, voltage signals, and/or ground signals) to the devices and/or the components of the IC device 90.

As illustrated in FIG. 13, the MLI structure 600 includes the sealing layer 500, the ILD 550, a layer 610 formed over the ILD 550, and another ILD 620 formed over the layer 610. As examples, the layer 610 may be an etching-stop layer, and the ILD 620 may be similar to the ILD 550 or 350. Since the ILD 350 may be referred to as an ILD0 layer, the ILD 550 may be referred to as an ILD1 layer, and the ILD 620 may be referred to as an ILD2 layer. The MLI structure 600 also includes electrically conductive components such as a source/drain contact 650 (e.g., electrically coupled to source/drain features of the IC device 90), a source/drain via 660 formed on the source/drain contact 650, and a gate contact 670 formed on the gate structure 140. The source/drain contact 650, the source/drain via 660, and the gate contact 670 may include metal or metal compounds. For example, the source/drain contact 650, the source/drain via 660, and the gate contact 670 may include cobalt, tungsten, ruthenium, copper, silver, or titanium. The source/drain contact 650, the source/drain via 660, and the gate contact 670 may be formed by etching trenches in the layers 500 and 610 and the ILD 550 and 620, and subsequently filling the trenches with the metal materials. Planarization processes such as CMP processes may be performed to planarize the upper surfaces of the source/drain contact 650, the source/drain via 660, and the gate contact 670.

It is understood that although the MLI structure 600 is depicted with a given number of dielectric layers and conductive layers, the present disclosure contemplates the MLI structure 600 having more dielectric layers and/or conductive layers or fewer dielectric layers and/or conductive layers.

FIG. 14 is a flowchart illustrating a method 900 of fabricating a semiconductor device according to another embodiment of the present disclosure. The method 900 includes a step 910 of forming a dummy gate over a substrate.

The method 900 includes a step 920 of forming a sacrificial layer over the dummy gate. In some embodiments, the step 920 includes forming an amorphous silicon layer as the sacrificial layer.

The method 900 includes a step 930 of forming an interlayer dielectric (ILD) over the dummy gate and over the sacrificial layer.

The method 900 includes a step 940 of replacing the dummy gate with a metal-containing gate. In some embodiments, the step 940 includes removing the dummy gate using one or more etching processes. The one or more etching processes partially etch away the sacrificial layer.

The method 900 includes a step 950 of removing the sacrificial layer, wherein a removal of the sacrificial layer leaves air gaps around the metal-containing gate. In some embodiments, the air gaps each have an elongated profile.

The method 900 includes a step 960 of sealing the air gaps. In some embodiments, the step 960 includes forming a sealing layer over the air gaps and over the metal-containing gate. In some embodiments, portions of the sealing layer extend partially into the air gaps. In some embodiments, the step 960 includes depositing a dielectric material as the sealing layer using a chemical vapor deposition (CVD) process.

It is understood that additional steps may be performed before, during, or after the steps 910-960. For example, the method 900 may include a step of: before the forming the sacrificial layer, forming dielectric gate spacers on sidewalls of the dummy gate. Portions of the sacrificial layer are formed on the dielectric gate spacers. The air gaps are disposed directly adjacent to the dielectric gate spacers. In some embodiments, the removing the sacrificial layer includes performing an etching process to etch away the sacrificial layer, and the etching process has an etching selectivity between the sacrificial layer and the dummy gate and the dielectric gate spacers. In some embodiments, the method 900 may include a step of forming an etching-stop layer over the sacrificial layer. Additional steps may include the formation of additional interconnect features, packaging, or testing processes.

In summary, the present disclosure involves forming air spacers for transistors. For example, a silicon-containing sacrificial layer (e.g., containing amorphous silicon or silicon germanium) is formed over dummy gates. The sacrificial layer has an etching selectivity with the dielectric gate spacers and etching-stop layers. After the dummy gates are replaced with metal gates, the sacrificial layer is removed, which forms air gaps in place of the removed sacrificial layer. Due to the etching selectivity between the sacrificial layer and the other components such as the metal gates, the dielectric gate spacers, and the etching-stop layer, the removal of the sacrificial layer does not damage these other components but leaves them substantially intact. The air gaps are then sealed at the top with a sealing layer.

Based on the above discussions, it can be seen that the present disclosure offers advantages over conventional source/drain vias. However, it is understood that not all advantages are discussed herein, different embodiments may offer different advantages, and that no particular advantage is required for any embodiment. One advantage is that the present disclosure can form air spacers and do so in a reliable manner. Conventional fabrication methods either do not utilize air spacers at all, or have difficulty forming air spacers reliably. As discussed above, air spacers have a low dielectric constant (close to 1), which helps reduce parasitic capacitance. The reduction in parasitic capacitance in turn improves device performance such as speed, which is particularly advantageous in certain high-speed IC applications such as ring oscillators. The air spacers formed by the present disclosure may also achieve a vertically elongated shape that is desirable for gate spacers. Furthermore, the size of the air spacers may be flexibly adjusted by configuring the thickness of the sacrificial layer during its deposition. As such, the dielectric constant of the gate spacers (including the air spacers) may be tunable to fit particular design requirements. Other advantages may include compatibility with existing fabrication processes and the ease and low cost of implementation.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

One aspect of the present disclosure pertains to a semiconductor fabrication method. A dummy gate is formed over a substrate. A sacrificial layer is formed over the dummy gate. An interlayer dielectric (ILD) is formed over the dummy gate and over the sacrificial layer. The dummy gate is replaced with a metal-containing gate. The sacrificial layer is removed. A removal of the sacrificial layer leaves air gaps around the metal-containing gate. The air gaps are sealed.

Another aspect of the present disclosure pertains to a semiconductor fabrication method. A dummy gate is formed over a substrate. A dielectric gate spacers are formed on sidewalls of the dummy gate. A sacrificial layer is formed on the dielectric gate spacers. The sacrificial layer and the dielectric gate spacers have different material compositions. An etching-stop layer is formed on the sacrificial layer. The etching-stop layer and the sacrificial layer have different material compositions. An interlayer dielectric (ILD) is formed over the dummy gate and over the etching-stop layer. The dummy gate is removed while leaving the ILD, the etching-stop layer, and the dielectric gate spacers substantially intact. A metal-containing gate is formed in place of the removed dummy gate. The sacrificial layer is removed while leaving the ILD, the etching-stop layer, and the dielectric gate spacers substantially intact.

Yet another aspect of the present disclosure pertains to a semiconductor device. A gate is disposed over a substrate. A dielectric gate spacer is disposed on a sidewall of the gate. An air gap is disposed directly adjacent to the dielectric gate spacer. A sealing layer is disposed over the air gap, the dielectric gate spacer, and the gate. An interlayer dielectric (ILD) is disposed over the sealing layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
    a gate disposed over a substrate;
    a dielectric gate spacer disposed on a sidewall of the gate;
    an air gap disposed directly adjacent to the dielectric gate spacer, wherein the air gap and the dielectric gate spacer have substantially coplanar bottom surfaces;
    a sealing layer disposed over at least the air gap;
    an interlayer dielectric (ILD) disposed over the sealing layer;
    an etching-stop layer, wherein the air gap is disposed between the etching-stop layer and the dielectric gate spacer; and
    a conductive contact that vertically extends from an upper surface of a portion of the substrate to an upper surface of a portion of the ILD, wherein the conductive contact extends through the sealing layer, and wherein the etching-stop layer and the conductive contact have substantially co-planar bottom surfaces.

2. The device of claim 1, wherein the etching-stop layer and the sealing layer have different material compositions.

3. The device of claim 1, wherein the ILD is a first ILD, and wherein the device further includes a second ILD that is disposed over a portion of the etching-stop layer and below the sealing layer.

4. The device of claim 2, wherein the conductive contact is a source/drain contact, wherein the source/drain contact is laterally surrounded by the etching-stop layer, and wherein the device further comprises:
a gate contact disposed above the gate and vertically extending through the sealing layer and the ILD.

5. The device of claim 1, wherein the air gap has an elongated shape in a cross-sectional view.

6. The device of claim 1, wherein the sealing layer extends partially into the air gap.

7. The device of claim 1, wherein the gate includes a metal gate electrode.

8. The device of claim 1, wherein the sealing layer is in direct contact with the gate and the dielectric gate spacer.

9. The device of claim 1, wherein an uppermost surface of the gate is more vertically elevated than a bottommost surface of the sealing layer.

10. The device of claim 1, wherein a first lateral dimension of the air gap is smaller than a second lateral dimension of the gate.

11. The device of claim 10, wherein the first lateral dimension is at least five times smaller than the second lateral dimension.

12. A device, comprising:
a gate structure formed over a substrate;
a gate spacer structure formed over the substrate and on sidewalls of the gate structure;
a first etching-stop layer formed over the substrate;
a sealing layer formed over the gate spacer structure;
a gap trapped between the substrate, the sealing layer, the gate spacer structure, and the first etching-stop layer, wherein no portion of the gate spacer structure is located directly below the gap;
a first interlayer dielectric (ILD) formed over the sealing layer;
a second etching-stop layer formed over the first ILD;
a second ILD formed over the second etching-stop layer;
a source/drain contact formed over the substrate and extending vertically through the sealing layer, wherein the source/drain contact extends from an upper surface of a portion of the substrate to an upper surface of the sealing layer;
a gate contact formed over the gate structure and extending vertically through the sealing layer, wherein the source/drain contact and the gate contact are located on opposite sides of the gap in a cross-sectional view, wherein the gate contact extends vertically through the sealing layer, the first ILD, the second etching-stop layer, and the second ILD; and
a source/drain via formed over the source/drain contact, wherein the source/drain via extends vertically through the second ILD and the second etching-stop layer.

13. The device of claim 12, wherein a portion of the source/drain contact is surrounded laterally by segments of the first etching-stop layer.

14. The device of claim 12, wherein:
the first etching-stop layer has a first dielectric material composition; and
the sealing layer has a second dielectric material composition different from the first dielectric material composition.

15. The device of claim 12, wherein the gap comprises an air gap.

16. The device of claim 12, wherein the gate structure is at least five times wider than the gap in a cross-sectional view.

17. A device, comprising:
a plurality of metal-containing gates located over a substrate;
a plurality of gate spacers located on sidewalls of each of the metal-containing gates;
a plurality of dielectric segments located over the substrate;
a plurality of openings located between the dielectric segments and the gate spacers, wherein at least portion of the substrate is exposed by at least one of the openings;
a dielectric layer located over the gate spacers;
a first interlayer dielectric (ILD) located between the dielectric layer and the dielectric segments;
a second ILD located over the dielectric layer a conductive contact extending vertically from an upper surface of a portion of the substrate to an upper surface of the second ILD, wherein the conductive contact extends through the dielectric layer vertically;
an etching-stop layer located over the first ILD;
a third ILD located over the etching-stop layer;
a conductive via that extends vertically from an upper surface of the conductive contact to an upper surface of the third ILD, wherein the conductive via extends vertically through the third ILD and the etching-stop layer; and
a gate contact disposed over at least one of the metal-containing gates, wherein the gate contact extends vertically through the third ILD, the etching-stop layer, the second ILD, and the dielectric layer, and wherein at least one of the gate contact or the conductive via has substantially co-planar upper surfaces with the third ILD.

18. The device of claim 17, wherein a width of each of the openings is at least five times smaller than a width of each of the metal-containing gates in a cross-sectional view, and wherein the dielectric segments and the dielectric layer have different material compositions.

19. The device of claim 17, further comprising a wherein the conductive via and the etching-stop layer have substantially co-planar bottom surfaces.

20. The device of claim 17, wherein a side surface of the conductive contact extends laterally to one of the dielectric segments, to the dielectric layer, and to the second ILD.

* * * * *